US012392828B2

(12) United States Patent
Kakosimos et al.

(10) Patent No.: US 12,392,828 B2
(45) Date of Patent: Aug. 19, 2025

(54) ESTIMATING AT LEAST ONE LEAKAGE INDUCTANCE OF A MULTI-PHASE ELECTRICAL MACHINE

(71) Applicant: ABB Schweiz AG, Baden (CH)

(72) Inventors: Panagiotis Kakosimos, Västerås (SE); Ingo Stroka, Västerås (SE); Georgios Stamatiou, Athens (GR)

(73) Assignee: ABB Schweiz AG, Baden (CH)

( * ) Notice: Subject to any disclaimer, the term of this patent is extended or adjusted under 35 U.S.C. 154(b) by 323 days.

(21) Appl. No.: 18/157,806

(22) Filed: Jan. 20, 2023

(65) Prior Publication Data

US 2023/0236249 A1 Jul. 27, 2023

(30) Foreign Application Priority Data

Jan. 20, 2022 (EP) .................................... 22152353

(51) Int. Cl.
*G01R 31/34* (2020.01)
*G01R 31/52* (2020.01)

(52) U.S. Cl.
CPC ........... *G01R 31/346* (2013.01); *G01R 31/52* (2020.01)

(58) Field of Classification Search
CPC .. H02K 15/0433; G01R 31/346; G01R 33/02; G01R 33/0206; G01R 33/12;
(Continued)

(56) References Cited

U.S. PATENT DOCUMENTS 7,039,542 B2 * 5/2006 Fujii .................... G01R 31/343 318/727
2019/0356256 A1 * 11/2019 Lamsahel ............... H02P 27/08

FOREIGN PATENT DOCUMENTS

DE 102015221310 A1 * 5/2017 .............. H02P 25/22

OTHER PUBLICATIONS

A. Tessarolo, S. Mohamadian and M. Bortolozzi, "A New Method for Determining the Leakage Inductances of a Nine-Phase Synchronous Machine From No-Load and Short-Circuit Tests," in IEEE Transactions on Energy Conversion, vol. 30, No. 4, pp. 1515-1527, Dec. 2015 (Year: 2015).*

(Continued)

*Primary Examiner* — Alexander Satanovsky
(74) *Attorney, Agent, or Firm* — Whitmyer IP Group LLC

(57) ABSTRACT

A method for estimating at least one leakage inductance of a 3n-phase electrical machine includes performing a first machine investigation scheme and a second machine investigation scheme, the first scheme including ordering a machine drive stage to control one of the 3-phase windings, obtaining a first set of measured currents from the 3-phase winding and processing the first set of measured currents to obtain primary characteristics of an electrical quantity of the electrical machine, the second scheme including ordering the machine drive stage to control all the 3-phase windings using a VSD control model, the controlling involving only controlling a first fundamental subspace of the VSD control model, obtaining a second set of measured currents from all 3-phase windings and processing the second set of measured currents to obtain a leakage inductance estimate and secondary characteristics of the electrical quantity, for which leakage inductance estimate the primary and secondary characteristics match.

20 Claims, 3 Drawing Sheets

(58) Field of Classification Search
CPC ........ G01R 31/52; G01R 31/34; G01R 19/00; H02P 23/14; H02P 21/16
See application file for complete search history.

(56) References Cited

OTHER PUBLICATIONS

IEEE Guide for Test Procedures for Synchronous Machines Including Acceptance and Performance Testing and Parameter Determination for Dynamic Analysis, in IEEE Std 115-2019 (Revision of IEEE Std 115-2009), vol. no., pp. 1-246, Mar. 27, 2020 (Year: 2020).*

Sheng, Shuang, et al.; "Parameters On-line Identification of Dual Three Phase Induction Motor by Voltage Vector Injection in Harmonic Subspace" ; Journal of International Conference on Electrical Machines and Systems (ICEMS), vol. 2, No. 3; Oct. 26, 2013; 7 Pages.

Che, Hang Seng, et al.; "Parameter Estimation of Asymmetrical Six-Phase Induction Machines Using Modified Standard Tests"; IEEE Transactions on Industrial Electronics, vol. 64, No. 8; IEEE Service Center, Piscataway, NJ, USA; Aug. 1, 2017; 11 Pages.

Abdel-Khalik, Ayman S., et al.; "Low-Order Space Harmonic Modeling of Asymmetrical Six-Phase Induction Machines"; IEEE Access, vol. 7; Jan. 23, 2019; 11 Pages.

Extended European Search Report; Application No. 22152353.3; Completed: Jun. 8, 2022; Issued: Jun. 20, 2022; 6 Pages.

* cited by examiner

ESTIMATING AT LEAST ONE LEAKAGE INDUCTANCE OF A MULTI-PHASE ELECTRICAL MACHINE

TECHNICAL FIELD

The present disclosure generally relates to multi-phase electrical machines and in particular to a method, device, computer program and computer program product for estimating at least one leakage inductance of a 3n-phase electrical machine as well as to an electrical machine system comprising such a device.

BACKGROUND

The leakage inductances of an n-phase electrical machine may be important to know, for instance in order to improve the way that the electrical machine is controlled. Knowledge of the leakage inductance may as an example be used for avoiding instability issues during control of the electrical machine. In some instances, knowledge of the leakage inductance can also be used for torque enhancement.

Different approaches are known to be used for estimating a leakage inductance.

One approach is described by Shuang Sheng, et al., in "Parameters On-line Identification of Dual Three Phase Induction Motor by Voltage Vector Injection in Harmonic Subspace", Journal of International Conference on Electrical Machines and Systems, Vol. 2, No. 3, page 288-294, 2013. According to the document a voltage vector is injected in a harmonic subspace and a clockwise rotated current vector is detected by transforming the stator currents to harmonic space. This is done in order to calculate the stator resistance and leakage inductance.

There exist various ways of estimating a leakage inductance, where some are performed when the electrical machine is designed and others are performed in the commissioning phase, i.e. when the electrical machine is placed in a location in which it is to be operated.

Some of these approaches are very sophisticated and/or complex in that they may need pure sinusoidal power supply, Recursive Least Squares (RLS) methods and/or the use of offline tests through winding rearrangement.

Pure sinus sources of variable amplitude and frequency are often not available during commissioning of an electrical machine. Winding rearrangement requires some effort and can be time consuming.

Other approaches are simple but inaccurate.

There is therefore need for a simple yet accurate way of determining at least one leakage inductance that does not require the use of additional equipment such as sinusoidal voltage supplies or additional activities, such as rearranging the machine windings.

SUMMARY

Aspects of the present invention are thus concerned with the problem of providing an improved estimation of at least one leakage inductance of a 3n-phase electrical machine.

This object is according to a first aspect achieved through a method of estimating at least one leakage inductance of a 3n-phase electrical machine having at least two 3-phase windings, the method comprising:

- performing a first machine investigation scheme comprising
  - ordering a machine drive stage to control one of the 3-phase windings,
  - obtaining from said one of the 3-phase windings a first set of measured currents of three phases of the electrical machine, and
  - processing the first set of measured currents to obtain primary characteristics of an electrical quantity of the electrical machine,
- performing a second machine investigation scheme comprising
  - ordering the machine drive stage to control all the 3-phase windings using a vector space decomposition (VSD) control model, where the controlling involves only controlling a first fundamental subspace of the VSD control model,
  - obtaining a second set of measured currents from all 3-phase windings, and
  - processing the second set of measured currents to obtain a leakage inductance estimate and secondary characteristics of the electrical quantity of the electrical machine, for which leakage inductance estimate the primary and secondary characteristics match.

The object is according to a second aspect achieved through a device for estimating at least one leakage inductance of a 3n-phase electrical machine having at least two 3-phase windings, the device comprising a processor being operative to:

- perform a first machine investigation scheme comprising
  - order a machine drive stage to control one of the 3-phase windings,
  - obtain from said one of the 3-phase windings a first set of measured currents of three phases of the electrical machine, and
  - process the first set of measured currents to obtain primary characteristics of an electrical quantity of the electrical machine, and
- perform a second machine investigation scheme comprising
  - order the machine drive stage to control all the 3-phase windings using a vector space decomposition (VSD) control model, where the controlling involves only controlling a first fundamental subspace of the VSD control model,
  - obtain a second set of measured currents from all 3-phase windings, and
  - process the second set of measured currents to obtain a leakage inductance estimate and secondary characteristics of the electrical quantity of the electrical machine, for which leakage inductance estimate the primary and secondary characteristics match.

The object is according to a third aspect achieved by a computer program for estimating at least one leakage inductance of a 3n-phase electrical machine having at least two 3-phase windings, the computer program being configured to implement the operation according to the first aspect when being operated on by the processor of the device according to the second aspect.

The object is according to a fourth aspect achieved by a computer program product for estimating at least one leakage inductance of a 3n-phase electrical machine having at least two 3-phase windings, the computer program product comprising a data carrier with the computer program according to the third aspect.

The object is according to a fifth aspect achieved through an electrical machine system comprising

- a 3n-phase electrical machine having at least two 3-phase windings, a machine drive stage configured to be connected to the electrical machine for controlling the 3-phase windings of the electrical machine, and a device for estimating at least one leakage inductance of the 3n-phase electrical machine according to the second aspect.

The electrical quantity of the electrical machine may be a current through or the impedance of the electrical machine.

The processing in the second machine investigation scheme may comprise a number of iterations.

In this case the obtained leakage inductance estimate of a first iteration may be an initial leakage inductance estimate for which the primary and secondary characteristics differ from each other. The processing performed in the second machine investigation scheme may in this case further comprise continuing iterating until the primary and secondary characteristics match, where the leakage inductance estimate of the iteration when there is a match may be the final leakage inductance estimate. This continued iteration may involve obtaining increased or decreased leakage inductance estimates until the primary and secondary characteristics match.

The primary and secondary characteristics may each comprise a number of components, where for each component in the primary characteristics there is a corresponding component of the secondary characteristics. A component in the primary characteristics and the corresponding component in the secondary characteristics may form a component pair. The primary characteristics may match the secondary characteristics when each component of the primary characteristics matches the corresponding component of the secondary characteristics.

The primary and secondary characteristics may comprise a primary harmonics content and a secondary harmonics content of the electrical quantity. In this case the primary harmonics content may comprise harmonic components of the electrical quantity and the secondary harmonic content may comprise corresponding harmonic components of the electrical quantity. Two harmonic components that correspond to each other, i.e. form a component pair, may be harmonics of the same order.

The harmonics content may comprise one or more amplitudes of harmonics of the electrical quantity. The harmonics content may be harmonics content of the electrical quantity in the frequency domain. The harmonics content may thereby comprise the amplitudes of the harmonic components of the electrical quantity.

The primary and secondary harmonics contents may be considered to match if a difference between the first and the second harmonics contents is within a set tolerance, such as 5, 2.5 or 1% of the first or the second harmonics content. The primary and secondary harmonics contents may be considered to match if a difference between each pair of components of the first and the second harmonics contents is within the set tolerance, such as within 5, 2.5 or 1% of the component of the first or the second harmonics content.

The leakage inductance estimate may be a leakage inductance estimate in an xy subspace of the VSD control model.

It is additionally possible that the secondary harmonics content is secondary harmonics content in the xy subspace of the VSD control model.

The ordering of the machine drive stage to control said one of the 3-phase windings may additionally comprise ordering the machine drive stage to control said one of the 3-phase windings using a first voltage and the ordering of the machine drive stage to control all the 3-phase windings using a vector space decomposition (VSD) control model may comprise ordering the machine drive stage to control all the 3-phase windings using a second voltage.

The processing in the first machine investigation scheme may additionally comprise applying the first voltage and the first set of measured currents in a first model expression that defines a primary harmonics relationship between voltage and current of the electrical machine.

It should be realized that it is possible to omit the use of the first voltage. For this to be possible, the switching pattern of the first investigation scheme does not vary significantly or is possible to reproduce based on signals/parameters available in the machine drive stage. This also works under the assumption that the two three-phase windings are identical and only shifted by a certain angle.

The first model expression may comprise a definition of the relationship between voltage and current for low order harmonics. The low order harmonics may be harmonics below the $20^{th}$ order harmonics, the $13^{th}$ order harmonics, or the $8^{th}$ order harmonics. The low order harmonics may thus comprise harmonic components below the $20^{th}$ order, the $13^{th}$ order, or the $8^{th}$ order.

The first machine investigating scheme may also comprise identifying parameters in the first model expression through minimising errors of the magnitudes of the fundamental current and/or low order harmonics. It is additionally possible that main electrical parameters of the 3-phase winding are determined based on the first voltage and the first set of measured currents, which may be done using standard tests on the fundamental components of the first voltage and the first set of current measurements.

The first voltage may be generated according to a first control model, such as a dual 3-phase (DTP) control model.

It is additionally possible that only currents from said one 3-phase winding are processed in the first machine investigation scheme. It is possible that no currents from the other 3-phase windings of the electrical machine are being processed in the first machine investigating scheme.

The first voltage and the first set of current measurements may be provided in the time domain. The primary harmonics content may additionally be the harmonics content of a current obtained via the first set of current measurements or the harmonics content of an impedance that is calculated based on the first set of current measurements. For this reason, the processing may comprise transforming the current and possibly also the first voltage into the frequency domain. If the harmonics content is the harmonics content of an estimated impedance, the processing may additionally or instead comprise determining the impedance based on the first voltage and the first set of current measurements.

It is furthermore possible that parameters are identified in the first model expression through minimising errors of the magnitudes of the fundamental current and/or low order harmonics.

The VSD control model is a second control model used in the second machine investigation scheme. It is additionally possible that the instruction may be an instruction to use a second voltage in the control. The processing in the second machine investigation scheme may thus be based on the second voltage.

It should be realized that it is possible to also omit the use of the second voltage. For this to be possible, the switching pattern of the second machine investigation scheme does not vary significantly or is possible to reproduce based on signals/parameters available in the machine drive stage. This also works under the assumption that the two three-phase windings are identical and only shifted by a certain angle.

It is possible that the load torque used in the second machine investigation scheme is twice the load torque of the first machine investigation scheme. The control of one of the 3-phase windings in the first machine investigation scheme may thereby use half the load torque of the control of all the 3-phase windings using the VSD control model in the second machine investigation scheme.

Also, the second voltage and the second set of current measurements may be provided in the time domain.

Furthermore, also the secondary harmonics content may be low order harmonics content, which low order harmonics content may be harmonics below the $20^{th}$ order harmonics, the $13^{th}$ order harmonics, or the $8^{th}$ order harmonics. The low order harmonics may thus also here comprise harmonic components below the $20^{th}$ order, the $13^{th}$ order, or the $8^{th}$ order. The secondary harmonics content may likewise be the harmonics content of the current or the harmonics content of an estimated impedance. For this reason, the processing may comprise transforming the current and possibly also the second voltage into the frequency domain. If the harmonics content is the harmonics content of an estimated impedance, the processing may additionally or instead comprise determining the impedance based on the second voltage and the second set of current measurements.

For a 2*3-phase electrical machine, i.e. a 6-phase electrical machine, the low order harmonics content of the primary and the secondary harmonics content may comprise the $5^{th}$ and/or the $7^{th}$ order harmonic components. These harmonic components may be the only harmonic components of the primary and secondary harmonics content.

It is additionally possible that the processing comprises applying the second voltage and the second set of measured currents in a second model expression of the second control model, where the second model expression defines a secondary harmonics relationship between the voltage and current of the electrical machine and where the secondary harmonics relationship has a dependency on the leakage inductance. The second model expression may additionally comprise a definition of the relationship between voltage and current for low order harmonics.

It is also possible that the processing involves identifying the magnitudes and angles of the low order harmonics in the second set of currents before application in the second model expression.

Moreover, if the main electrical parameters of the 3-phase winding were determined based on the first voltage and the first set of measured currents, it is also possible that the electrical parameters of the fundamental subspace of the VSD control model are estimated based on these parameters.

Through the use of the first and second machine investigation schemes described above it is possible to approximate the value of the leakage inductance during commissioning and then to use the obtained information for improving both the electrical machine design and control. No sinusoidal signal source or winding rearrangement is needed. The estimation may also be accurate.

Generally, all terms used in the claims are to be interpreted according to their ordinary meaning in the technical field, unless explicitly defined otherwise herein. All references to "a/an/the element, apparatus, component, means, etc." are to be interpreted openly as referring to at least one instance of the "element, apparatus, component, means, etc.", unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art.

Like numbers refer to like elements throughout the description.

Figure 1:
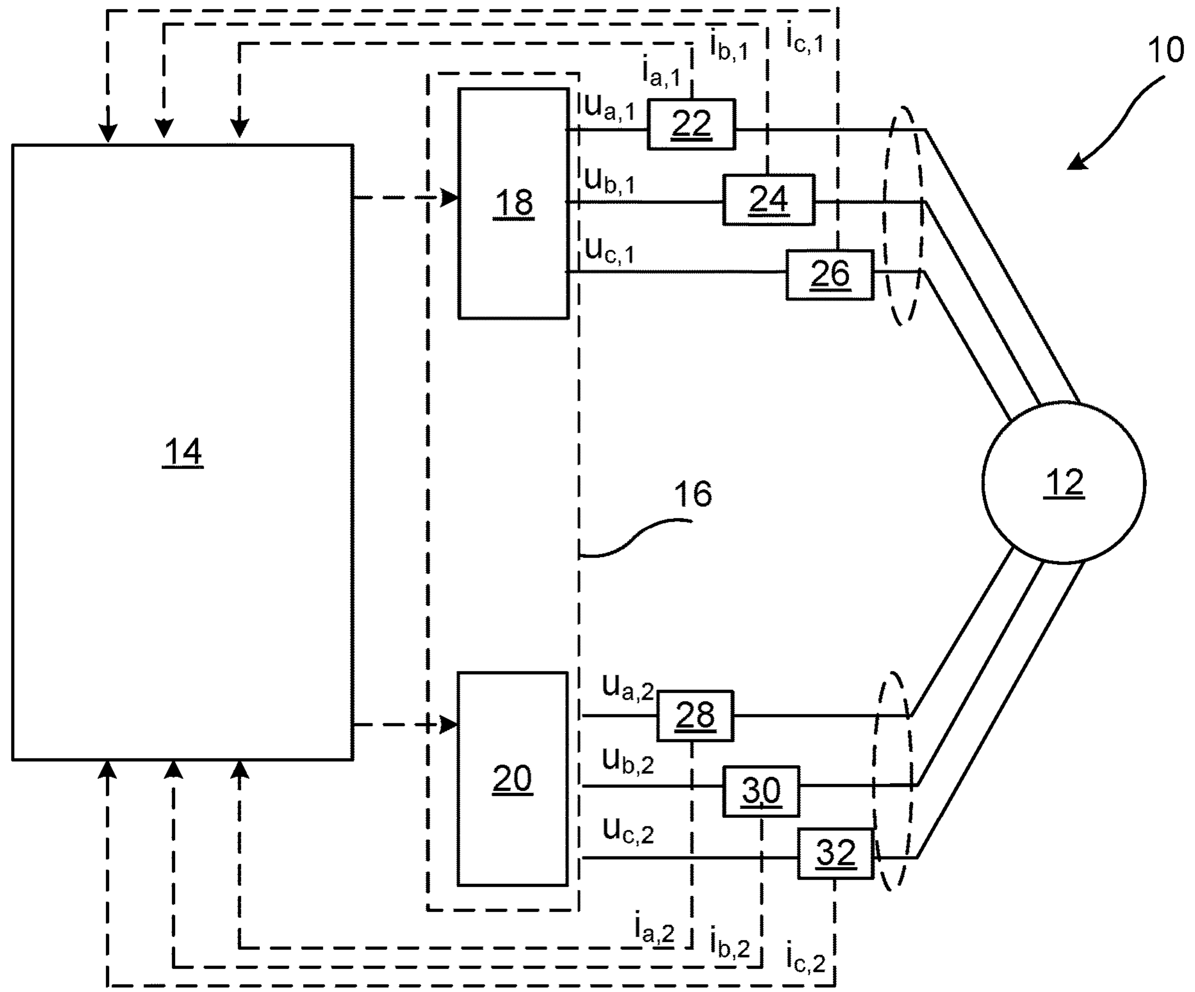
FIG. 1 schematically shows an electrical machine system comprising an electrical machine, an estimating device and a machine drive stage comprising a first and a second machine drive, FIG. 2 schematically shows one realization of the estimating device.

FIG. 1 shows an example of an electrical machine system 10. The electrical machine system 10 comprises a 3n-phase electrical machine 12, i.e. an electrical machine that has n groups of windings, where each group comprises three windings in different electrical phases, all the three different electrical phases in each group being different from each other. As an example, the electrical machine has two groups of windings, where each group comprises three windings. A group of windings may here be a group of stator windings. Such a group of windings may also be denoted a 3-phase winding. The electrical machine system 10 in the example in FIG. 1 is a 2*3-phase electrical machine, i.e. a 6-phase electrical machine. In this case there is thus a first 3-phase winding and a second 3-phase winding.

The electrical machine is thus a multi-phase electrical machine, such as a multi-phase motor or a multi-phase generator, having a stator and a rotor. By a multi-phase electrical machine is meant an electrical machine with more than three electrical phases. The multi-phase electrical machine may be a 3n-phase electrical machine, where n is an integer equal to or greater than 2. The electrical machine 12 may be a synchronous machine or an asynchronous machine.

There is also a machine drive stage 16 provided for controlling the electrical machine 12, which machine drive stage 16 comprises n machine drives. In the present example there is a first machine drive 18 for driving a first 3-phase winding of the machine 12 and a second machine drive 20 for driving a second 3-phase winding of the electrical machine 12. The first machine drive 18 drives the first 3-phase winding using a first set of phase voltages ua,1, ub,1 and uc,1. The second machine drive 20 drives the second three-phase winding using a second set of phase voltages ua,2, ub,2 and uc,2. The first set of phase voltages may be used to form a first voltage used to control one of the 3-phase windings, which in this case is the first 3-phase winding. Furthermore, the first set of phase voltages together with the second set of phase voltages form a second voltage used to control all the 3-phase windings of the electrical machine. Each machine drive 18, 20 may be implemented as a power converter, such as a voltage source converter, for instance a modular multilevel converter (MMC). However also other realizations are possible, such as a two-level converter. In the example in FIG. 1, the electrical machine system 10 includes exactly two power converters.

There is also an estimating device 14 for estimating at least one leakage inductance of the 3n-phase electrical machine 12. The estimating device 14 provides control commands to the first and second machine drives 18, 20 as well as receives current measurements from the electrical machine 12.

For this reason there is a first current sensor 22 in a first phase of the first 3-phase winding, a second current sensor 24 in a second phase of the first 3-phase winding, a third current sensor 26 in a third phase of the first 3-phase winding, a fourth current sensor 28 in a first phase of the second 3-phase winding, a fifth current sensor 30 in a second phase of the second 3-phase winding and a sixth current sensor 32 in a third phase of the second 3-phase winding.

The current sensors 22, 24, 26, 28, 30, 32, which may be realized as current measurement transformers, measure the phase currents i1, i2, . . . , i3*n* in each of the 3n phases of the electrical machine 12. The current sensors 22, 24, 26, 28, 30 and 32 are configured to send the measured currents to the estimating device 14. The first, second and third current sensors 22, 24 and 26 are thus configured to measure the phase currents of the first 3-phase winding and to send them in a first set of measured currents ia,1, ib,1 and ic,1 comprising measurements of these phase currents to the estimating device 14, while the fourth, fifth and sixth current sensors 28, 30 and 32 are configured to measure the phase currents of the second 3-phase winding and to send them in a second set of current measurements ia,2, ib,2 and ic,2 comprising these phase current measurements to the estimating device 14. As will be seen later, the second set of current measurements also comprises measurements from the first 3-phase winding, i.e. from the first, second and third sensors 22, 24 and 26. However, the first set of current measurements only comprise measurements from the first, second and third sensors 22, 24 and 26.

The current measurements received from the current sensors 22, 24, 26, 28, 30, 32 and the commands sent to the machine drives 18, 20 are shown with dashed arrows.

Figure 2:
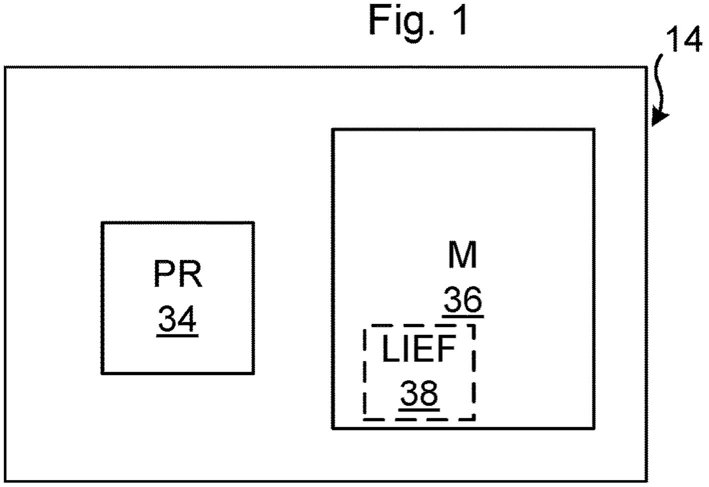

FIG. 2 schematically shows one realization of the estimating device 14. It may be realized as a processor PR 34 and a memory M 36 comprising a computer program 38 that implements a leakage inductance estimating function LIEF. The computer program 38 may thereby have computer program code, software code or computer instructions implementing the function. The processor 34 thereby implements the leakage inductance estimating function LIEF when running the computer program 38.

It should be realized that the processor may be a central processing unit (CPU), multiprocessor, a digital signal processor (DSP) or the processor of an application specific integrated circuit (ASIC), field programmable gate array (FPGA) etc., capable of performing the leakage inductance estimating function. The memory 36 may for example be a random-access memory (RAM), a read-only memory (ROM), an erasable programmable read-only memory (EPROM), or an electrically erasable programmable read-only memory (EEPROM)

Figure 3:
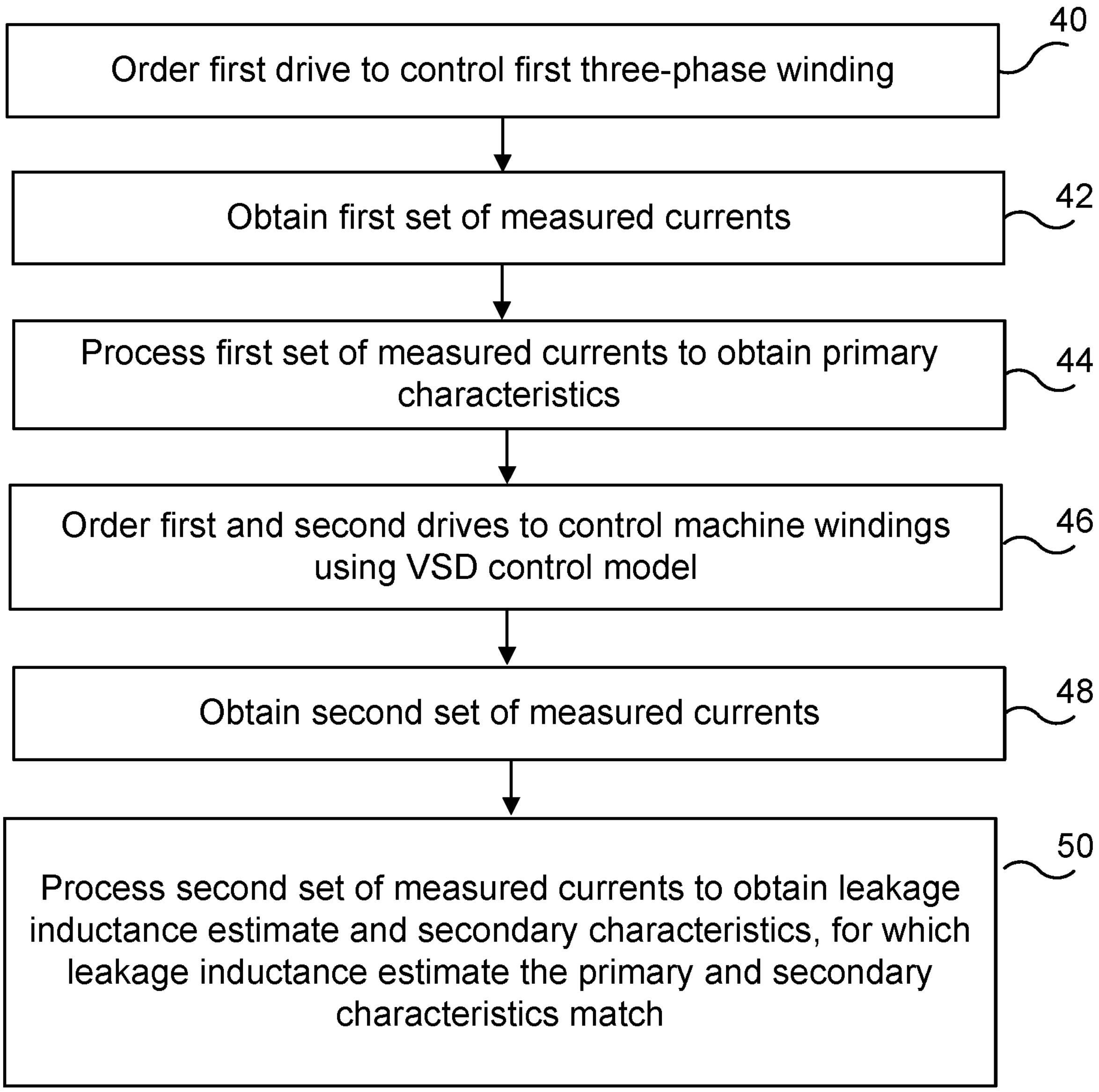
FIG. 3 shows a flow chart of a first embodiment of a method of estimating the leakage inductance of a 3n-phase electrical machine.

FIG. 3 shows a flow chart of a number of method steps in a first embodiment of a method of estimating at least one leakage inductance, which method steps are caried out by the leakage inductance estimating function LIEF of the estimating device 14.

The operation is based on the use of the so-called vector space decomposition (VSD) control model.

In the VSD control model some basic transformations in the machine currents are executed. A VSD transform provides mutually orthonormal subspaces of the fundamental frequency and lower harmonics. In case of a dual 3-phase electrical machine, the six measured currents are typically first transformed to the $\alpha\beta$, the xy, and the o1o2 subspaces by VSD transformation, and then to the dq domain. The $\alpha\beta$ subspace is the subspace which contains the fundamental frequency plus the $h^{th}$ harmonic, h=12m±1 and m=1, 2, 3 . . . , the xy subspace is the subspace which contains the kth harmonic, k=12l±5, l=0, 1, 2, 3 . . . , i.e. the $5^{th}$ harmonic and so on, and the o1o2 subspace is the subspace for all the zero sequence harmonics. In case for example of a 6-phase electrical machine the $3^{rd}$ harmonic is zero if the two neutrals are not connected, and if the neutrals are connected, the 0102 subspace is the subspace for the 3rd harmonic. A leakage inductance parameter can be found in all of the subspaces. The control model also typically comprises parameters in the different subspaces for the resistance of the electrical machine. Specifically, the VSD transform provides insight about the low-order harmonics.

Now the operation of the estimating device 14 will be described.

The leakage inductance estimating function LIEF of the estimating device 14 performs a first machine investigation scheme, which is followed by a second machine investigation scheme.

In the first machine investigation scheme the leakage inductance estimating function LIEF orders the machine drive stage 16 to control one of the 3-phase windings. In the present example it orders the first machine drive 18 to control the first 3-phase winding of the electrical machine 12, step 40. This may be an order to supply a first alternating current (AC) voltage on the first 3-phase winding. The control may involve a control using the first voltage, which first voltage may be generated according to a first control model, such as the dual 3-phase (DTP) control model. The second 3-phase winding may or may not receive the first voltage.

After this control, the leakage inductance estimating function LIEF obtains a first set of measured currents ia,1, ib,1, ic,1 of three phases of the electrical machine 12 from said one of the 3-phase windings, step 42. This may be done through the first, second and third current sensors 22, 24 and 26 sensing the phase currents of the first 3-phase winding and sending these measurements to the estimating device 14.

When the estimating device 14 has received this first set of current measurements the leakage inductance estimating function LIEF then processes it to obtain primary characteristics of an electrical quantity of the electrical machine, step 44.

The electrical quantity of the electrical machine may be a current through or the impedance of the electrical machine.

The primary characteristics of the electrical quantity may comprise a number of components. The primary characteristics may additionally comprise a primary harmonics content of the electrical quantity, which primary harmonics content may thereby comprise a number of harmonic components of the electrical quantity. The primary harmonics content may comprise one or more amplitudes of harmonics of the electrical quantity. The harmonics content may be harmonics content of the electrical quantity in the frequency domain. The harmonics content may thereby comprise the amplitudes of the harmonic components of the electrical quantity.

In this first machine investigation scheme, no currents from the second 3-phase winding are processed. No currents from the fourth, fifth and sixth current sensors 28, 30, 32 are thus processed.

The first voltage and the first set of current measurements are here provided in the time domain.

It can also be mentioned that the primary harmonics content may be low order harmonics content, which low order harmonics content may be harmonics below the $20^{th}$ order harmonics, the $13^{th}$ order harmonics, or the $8^{th}$ order harmonics. The primary harmonics content may additionally be the harmonics content of a current obtained via the first set of current measurements or the harmonics content of an impedance that is calculated based on the first set of current measurements. For this reason, the processing may comprise transforming the current and possibly also the first voltage into the frequency domain. If the harmonics content is the harmonics content of an estimated impedance, the processing may additionally or instead comprise determining the impedance based on the first voltage and the first set of current measurements.

It is additionally possible that the processing is part of processing made in relation to the first control model, which first control model may thus be the DTP model. However, it should be realized that also other control models are feasible.

If there is a first control model, the processing may additionally comprise applying the first voltage and the first set of measured currents in a first model expression that defines a primary harmonics relationship between voltage and current of the electrical machine 12. The first model expression may additionally comprise a definition of the relationship between voltage and current for low order harmonics.

It is additionally possible that main electrical parameters of the 3-phase winding are determined based on the first voltage and the first set of measured currents, which may be done using standard tests on the fundamental components of the first voltage and the first set of current measurements.

It is furthermore possible that parameters are identified in the first model expression through minimising errors of the magnitudes of the fundamental current and/or low order harmonics.

The first machine investigation scheme may then be ended.

After the first machine investigation scheme has been completed, the leakage inductance investigating function LIEF continues and performs the second machine investigation scheme.

In this second machine investigation scheme the leakage inductance estimating function LIEF orders the machine drive stage 16 to control all the 3-phase windings using the VSD control model, where the controlling involves only controlling a first fundamental subspace of the VSD control model, step 46. This may more particularly involve ordering the first and the second machine drives 18 and 20 to perform the control. The instruction may also be an instruction to use a second voltage, which may be an AC voltage. The VSD control model is a second control model used in the second machine investigation scheme.

It is here possible that the load torque used in the second machine investigation scheme is twice the load torque of the first machine investigation scheme. The control of one of the 3-phase windings in the first machine investigation scheme may thereby use half the load torque of the control of all the 3-phase windings using the VSD control model in the second machine investigation scheme.

The leakage inductance estimating function LIEF may additionally obtain a second set of measured currents from all 3-phase windings, step 48. This may be done through the first, second and third current sensors 22, 24, 26 sensing the phase current of the first 3-phase winding and sending these measurements to the estimating device 14, and the fourth, fifth and sixth current sensors 22, 24, 26 sensing the phase current of the second 3-phase winding and sending these measurements to the estimating device 14.

Also, the second voltage and the second set of current measurements may be provided in the time domain and transformed into the frequency domain.

Thereafter the leakage inductance estimating function LIEF processes the second set of measured currents to obtain a leakage inductance estimate and secondary characteristics of the electrical quantity of the electrical machine, for which leakage inductance estimate the primary and secondary characteristics match, step 50.

The secondary characteristics may comprise a number of components, each corresponding to a component of the primary characteristics. Thereby, for each component in the primary characteristics there is a corresponding component of the secondary characteristics. A component in the primary characteristics and the corresponding component in the secondary characteristics may then form a component pair. The primary characteristics may in this case match the secondary characteristics when each component of the primary characteristics matches the corresponding component of the secondary characteristics.

Again, the electrical quantity may be a current through or an impedance of the electrical machine.

The processing in the second machine investigation scheme may comprise a number of iterations.

In this case the obtained leakage inductance estimate of a first iteration may be an initial leakage inductance estimate for which the primary and secondary characteristics differ from each other. The initial leakage inductance estimate may as an example be set based on design guidelines that exist for the electrical machine, simulations made after the design phase, or calculations from geometrical characteristics of the electrical machine.

The processing performed in the second machine investigation scheme may in this case further comprise continuing iterating until the primary and secondary characteristics match, where the leakage inductance estimate of the iteration when there is a match may be the final leakage inductance estimate. This continued iteration may involve obtaining increased or decreased leakage inductance estimates until the primary and secondary characteristics match.

It is in this case possible that each pair of corresponding components are matched one at a time. The matching of a following component pair may in this case lead to a previously matched component pair no longer matching. It is thereby also possible that the leakage inductance estimate is changed for successively matching component pairs until all component pairs simultaneously match.

The secondary characteristics may comprise a secondary harmonics content of the electrical quantity. Also, the secondary harmonics content may comprise one or more amplitudes of harmonics of the electrical quantity. The harmonics content may thus comprise harmonic components of the electrical quantity in the frequency domain. The harmonics content may more particularly comprise the amplitudes of the harmonic components of the electrical quantity.

Thereby the primary harmonics content may comprise harmonic components of the electrical quantity and the secondary harmonics content may comprise corresponding harmonic components of the electrical quantity, where two harmonic components that correspond to each other, i.e. a component pair, may be harmonics of the same order.

The leakage inductance may thus be repeatedly estimated until the harmonics content obtained via the first machine investigation scheme and the harmonics content obtained via the second machine investigation scheme match.

The primary and secondary harmonics contents may be considered to match if a difference between the first and the second harmonics contents is within a set tolerance, such as, 5, 2.5 or 1% of the first or second harmonics content. It is for instance possible that there is a match if each difference between the compared components of the first and the second harmonics contents is within the set tolerance, where for a pair of compared components, the tolerance may be within 5, 2.5 or 1% of the component of the first or the second harmonics content. It is additionally possible that it is the difference between the amplitudes of the harmonic components of the primary and secondary harmonics content that is within the set tolerance in order for a match to exist.

The leakage inductance estimate may be a leakage inductance estimate in an xy subspace of the VSD control model. It is additionally possible that the secondary harmonics content is secondary harmonics content in the xy subspace of the VSD control model.

The processing in the second machine investigation scheme may also be based on the second voltage.

It is possible to perform the processing without the first voltage and the second voltage in case the switching patterns of the first and second machine investigations do not vary significantly, or they can be reproduced based on signals/parameters available in the machine drive stage. This also works under the assumption that the two three-phase windings are identical and only shifted by a certain angle.

Furthermore, also the secondary harmonics content may be low order harmonics content, which low order harmonics content may be harmonics below the $20^{th}$ order harmonics, the $13^{th}$ order harmonics, or the $8^{th}$ order harmonics.

For a 2*3-phase electrical machine, i.e. a 6-phase electrical machine, the low order harmonics content of the primary and the secondary harmonics content may comprise the $5^{th}$ and/or the $7^{th}$ order harmonic components. These harmonic components may then be the only harmonic components of the primary and secondary harmonics content.

The secondary harmonics content may likewise be the harmonics content of the current or the harmonics content of an estimated impedance. For this reason, the processing may comprise transforming the current and possibly also the second voltage into the frequency domain. If the harmonics content is the harmonics content of an estimated impedance, the processing may additionally or instead comprise determining the impedance based on the second voltage and the second set of current measurements.

It is additionally possible that the processing comprises applying the second voltage and the second set of measured currents in a second model expression of the second control model, where the second model expression defines a secondary harmonics relationship between the voltage and current of the electrical machine and where the secondary harmonics relationship has a dependency on the leakage inductance. The second model expression may additionally comprise a definition of the relationship between voltage and current for low order harmonics.

It is also possible that the processing involves identifying the magnitudes and angles of the low order harmonics in the second set of currents before application in the second model expression.

Moreover, if the main electrical parameters of the 3-phase winding are determined based on the first voltage and the first set of measured currents, it is also possible that the electrical parameters of the fundamental subspace of the VSD control model are estimated based on these parameters.

Through the use of the first and second machine investigation schemes described above it is possible to approximate the value of the leakage inductances during commissioning and then to use the obtained information for improving both the electrical machine design and control.

The leakage inductance that has been estimated below is a leakage inductance between the first and the second 3-phase winding. If there are more 3-phase windings, the estimated leakage inductance may be considered to be a leakage inductance that is associated also with these other 3-phase windings. Alternatively, there may be more subspaces for which further harmonics contents are being matched with the first harmonics content for determining further leakage inductances of the electrical machine.

A second embodiment will soon be described which is based on the use of the DTP control model as the first control model and the VSD control model as the second control model. However, before the second embodiment is described, an analysis of the DTP and the VSD control models will be given.

For the analysis, a three-phase electrical machine with a non-isotropic rotor and non-ideally distributed windings is considered. The $5^{th}$ and $7^{th}$ harmonics are the most prevailing harmonics in the machine currents; therefore, the analysis below establishes ways of transforming these harmonics into a harmonic subspace which rotates with an angular speed of $5\omega_{me}$ and $7\omega_{me}$ respectively, where $\omega_{me}$ is the electrical angular speed. Also, according to the VSD theory, the $5^{th}$ and $7^{th}$ harmonics are mapped to the same harmonic subspace. The three phase currents $i_{x,h}$, are expressed as:

$$i_{a,h} = \hat{i}_h \cos(h\omega_{me}t + \theta_h) \quad (1)$$

$$i_{b,h} = \hat{i}_h \cos\left(h\omega_{me}t + \theta_h - \frac{2h\pi}{3}\right)$$

$$i_{c,h} = \hat{i}_h \cos\left(h\omega_{me}t + \theta_h + \frac{2h\pi}{3}\right)$$

where x∈{a, b, c}, h denotes the order of the harmonic, and eh is the phase angle of the $h^{th}$ current harmonic.

In equation (1), the three phase currents of the fundamental harmonic are sequentially different by 27 degrees. For the $5^{th}$ harmonic, the direction of the current vector rotation is reverse to that of the fundamental one, whereas for the $7^{th}$ harmonic, the rotation is the same to that of the fundamental one. By applying the Clarke and Park transformations to the current harmonics up the $7^{th}$ harmonic, these are converted to $6^{th}$-order harmonics in the dq reference frame. The total currents in the dq reference frame of the fundamental harmonic are:

$$i_{d,1st}=i_{d,1}+i_{d,5}\cos(-6\omega_{me}t+\theta_5)+i_{d,7}\cos(6\omega_{me}t+\theta_7)$$

$$i_{q,1st}=i_{q,1}+i_{q,5}\sin(-6\omega_{me}t+\theta_5)+i_{q,7}\sin(6\omega_{me}t+\theta_7) \quad (2)$$

The voltage balance scalar equations are:

$$u_{d,1st} = r_s i_{d,1st} + \frac{d\lambda_{d,1st}}{dt} - \omega_{me}\lambda_{q,1st} \quad (3)$$

$$u_{q,1st} = r_s i_{q,1st} + \frac{d\lambda_{q,1st}}{dt} + \omega_{me}\lambda_{d,1st}$$

where $r_s$ is the resistance of the stator winding, whereas the (magnetizing) flux linkages are expressed as:

$$\lambda_{d,1st} = l_{d,1} i_{d,1st} + \lambda_{mg,1}$$

$$\lambda_{q,1st} = l_{q,1} i_{q,1st} \quad (4)$$

where $l_{d,1}$ and $l_{q,1}$ are the (magnetizing) inductances, and $\lambda_{mg,1}$ is the flux linkage established by the permanent magnets. By substituting equations (2) and (4) in equation (3) and considering only steady-state operation, the voltage equations in the dq reference frame of the fundamental harmonic are given as:

$$u_{d,1st} = r_s i_{d,1} - \omega_{me} l_{q,1} i_{q,1} \quad (5)$$
$$+5\omega_{me} l_{q,5} i_{q,5} \sin(-6\omega_{me}t + \theta_5) + r_s i_{d,5} \cos(-6\omega_{me}t + \theta_5)$$
$$-7\omega_{me} l_{q,7} i_{q,7} \sin(6\omega_{me}t + \theta_7) + r_s i_{d,7} \cos(6\omega_{me}t + \theta_7)$$

$$u_{q,1st} = r_s i_{q,1} + \omega_{me} l_{d,1} i_{d,1} + \omega_{me}\lambda_{mg,1} \quad (6)$$
$$-5\omega_{me} l_{q,5} i_{q,5} \cos(6\omega_{me}t + \theta_5) + r_s i_{q,5} \sin(6\omega_{me}t + \theta_5)$$
$$+7\omega_{me} l_{d,7} i_{d,7} \cos(6\omega_{me}t + \theta_7)(6) + r_s i_{q,7} \sin(6\omega_{me}t + \theta_7)$$

In the voltage equations (5) and (6), the terms due to the $5^{th}$ and $7^{th}$ harmonics are AC quantities, whereas only the fundamental current components are DC quantities. Therefore, the steady-state voltage is further simplified to equation (7):

$$u_{d,1st} \approx r_s i_{d,1} - \omega_{me} l_{q,1} i_{q,1}$$

$$u_{q,1st} \approx r_s i_{q,1} + \omega_{me} l_{d,1} i_{d,1} + \omega_{me}\lambda_{mg,1} \quad (7)$$

The same approach is followed for the $5^{th}$ harmonic. A harmonic reference frame which follows the rotation of the $5^{th}$ harmonic is considered, and the total currents in this harmonic frame are as follows:

$$i_{d,5th} = i_{d,5} + i_{d,1}\cos(6\omega_{me}t + \theta_5) + i_{d,7}\cos(12\omega_{me}t + \theta_7)$$

$$i_{q,5th} = i_{q,5} + i_{q,1}\sin(6\omega_{me}t + \theta_5) + i_{q,7}\sin(12\omega_{me}t + \theta_7) \quad (8)$$

If substituting equation (8) in the dynamic voltage equations, the steady-state voltages become as next:

$$u_{d,5th} = r_s i_{d,5} + 5\omega_{me} l_{q,5} i_{q,5} \quad (9)$$
$$-\omega_{me} l_{q,1} i_{q,1} \sin(6\omega_{me}t + \theta_1) + r_s i_{d,1} \cos(6\omega_{me}t + \theta_1)$$
$$-7\omega_{me} l_{q,7} i_{q,7} \sin(12\omega_{me}t + \theta_7) + r_s i_{d,7} \cos(12\omega_{me}t + \theta_7)$$

$$u_{q,5th} = r_s i_{q,5} - 5\omega_{me} l_{d,5} i_{d,5} - 5\omega_{me}\lambda_{mg,5} \quad (10)$$
$$+\omega_{me} l_{q,1} i_{q,1} \cos(6\omega_{me}t + \theta_1) + r_s i_{q,1} \sin(6\omega_{me}t + \theta_1)$$
$$+7\omega_{me} l_{d,7} i_{d,7} \cos(12\omega_{me}t + \theta_7) + r_s i_{q,7} \sin(12\omega_{me}t + \theta_7)$$

Again, if removing the AC quantities in (9) and (10), the total steady-state voltages are given by:

$$u_{d,5th} \approx r_s i_{d,5} + 5\omega_{me} l_{q,5} i_{q,5}$$

$$u_{q,5th} \approx r_s i_{q,5} - 5\omega_{me} l_{d,5} i_{d,5} - 5\omega_{me}\lambda_{mg,5} \quad (11)$$

It can be seen that Equation (11) is part of a first model expression that defines a primary harmonics relationship between the voltage and current of the electrical machine and into which the first voltage and the first set of measured currents are applied. It can also be seen that the equation comprises a definition of the relationship between voltage and current for low order harmonics, and more particularly for the $5^{th}$ order harmonics.

Similarly, to the fundamental and $5^{th}$ harmonics, a rotating reference frame, which follows the rotation of the $7^{th}$ harmonic, is also considered as follows:

$$i_{d,7th} = i_{d,7} + i_{d,1}\cos(-6\omega_{me}t + \theta_1) + i_{d,5}\cos(-12\omega_{me}t + \theta_5) \quad (12)$$

$$i_{q,7th} = i_{q,7} + i_{q,1}\sin(-6\omega_{me}t + \theta_5) + i_{q,5}\sin(-12\omega_{me}t + \theta_5)$$

$$u_{d,7th} = r_s i_{d,7} - 7\omega_{me} l_{q,7} i_{q,7} \quad (13)$$
$$-\omega_{me} l_{q,1} i_{q,1} \sin(-6\omega_{me}t + \theta_1) + r_s i_{d,1} \cos(-6\omega_{me}t + \theta_1)$$
$$+5\omega_{me} l_{q,5} i_{q,5} \sin(-12\omega_{me}t + \theta_5) + r_s i_{d,5} \cos(-12\omega_{me}t + \theta_5)$$

$$u_{q,7th} = r_s i_{q,7} + 7\omega_{me} l_{d,7} i_{d,7} + 7\omega_{me}\lambda_{mg,7} \quad (14)$$
$$+\omega_{me} l_{q,1} i_{q,1} \cos(-6\omega_{me}t + \theta_1) + r_s i_{q,1} \sin(-6\omega_{me}t + \theta_1)$$
$$-5\omega_{me} l_{d,5} i_{d,5} \cos(-12\omega_{me}t + \theta_5) + r_s i_{q,5} \sin(-12\omega_{me}t + \theta_5)$$

$$u_{d,7th} \approx r_s i_{d,7} - 7\omega_{me} l_{q,7} i_{q,7} \quad (15)$$

$$u_{q,7th} \approx r_s i_{q,7} + 7\omega_{me} l_{d,7} i_{d,7} + 7\omega_{me}\lambda_{mg,7}$$

Also, equation (15) is an example of a first model expression that defines a primary harmonics relationship between the voltage and current of the electrical machine and into which the first voltage and the first set of measured currents are applied. It is also evident that the equation comprises a definition of the relationship between voltage and current for low order harmonics, which in this case is the $7^{th}$ order harmonics.

In order to perform the leakage inductance estimation, it is of interest to associate the model parameters in the VSD control model for a six-phase electrical machine with those of the harmonic model of the three-phase electrical machine as described earlier. The VSD transformation for a six-phase electrical machine possesses the following properties:

1. "The fundamental component of the machine variables and the kth order harmonics with k=12m±1, (m=1, 2, 3, . . . ) are transformed into the dq subspace."

2. "Harmonics with k=6m±1, (m=1, 3, 5, . . . ), i.e., the 5th, 7th, 17th, 19th, . . . harmonics, are mapped into the xy subspace."

3. "Zero sequence (m–3) harmonics, which are also non-electro-mechanical energy conversion related, are mapped into the o1o2 subspace."

In the VSD control model, it is possible that the following assumptions have been made in deriving the dual three-phase machine model: (1) the machine windings are sinusoidally distributed, (2) the flux path is linear, and (3) the mutual leakage inductances are neglected. The fact that the machine windings are sinusoidally distributed is an ideal case which may create some inconsistency with actual operation. Therefore, the previously described single three-phase test allows identifying these parameters which then helps to estimate the six-phase model parameters. More specifically, the main voltage equations in the dq reference domain for the different subspaces according to the VSD theory are:

$$u_{d,\alpha\beta} = r_s i_{d,\alpha\beta} + \frac{d\lambda_{d,\alpha\beta}}{dt} - \omega_{me}\lambda_{q,\alpha\beta} + \frac{d\lambda_{ld,\alpha\beta}}{dt} - \omega_{me}\lambda_{lq,\alpha\beta} \quad (16)$$

$$u_{q,\alpha\beta} = r_s i_{q,\alpha\beta} + \frac{d\lambda_{q,\alpha\beta}}{dt} + \omega_{me}\lambda_{d,\alpha\beta} + \frac{d\lambda_{lq,\alpha\beta}}{dt} + \omega_{me}\lambda_{ld,\alpha\beta}$$

$$u_{d,o_1o_2} = r_s i_{d,o_1o_2} + \frac{d\lambda_{d,o_1o_2}}{dt} - 3\omega_{me}\lambda_{q,o_1o_2} + \frac{d\lambda_{ld,o_1o_2}}{dt} - 3\omega_{me}\lambda_{lq,o_1o_2}$$

$$u_{q,o_1o_2} = r_s i_{q,o_1o_2} + \frac{d\lambda_{q,o_1o_2}}{dt} + 3\omega_{me}\lambda_{d,o_1o_2} + \frac{d\lambda_{lq,o_1o_2}}{dt} + 3\omega_{me}\lambda_{ld,o_1o_2}$$

$$u_{d,xy} = r_s i_{d,xy} + \frac{d\lambda_{d,xy}}{dt} - 5\omega_{me}\lambda_{q,xy} + \frac{d\lambda_{ld,xy}}{dt} - 5\omega_{me}\lambda_{lq,xy}$$

$$u_{q,xy} = r_s i_{q,xy} + \frac{d\lambda_{q,xy}}{dt} + 5\omega_{me}\lambda_{d,xy} + \frac{d\lambda_{lq,xy}}{dt} + 5\omega_{me}\lambda_{ld,xy}$$

where $\omega_{me}$ is the electrical angular velocity. The (magnetizing) flux linkages are expressed as:

$$\lambda_{d,\alpha\beta} = l_{d,\alpha\beta} i_{d,\alpha\beta} + \lambda_{mg,\alpha\beta} \quad (17)$$

$$\lambda_{q,\alpha\beta} = l_{q,\alpha\beta} i_{q,\alpha\beta}$$

$$\lambda_{d,o_1o_2} = l_{d,o_1o_2} i_{d,o_1o_2} + \lambda_{mg,o_1o_2}$$

$$\lambda_{q,o_1o_2} = l_{q,o_1o_2} i_{q,o_1o_2}$$

$$\lambda_{d,xy} = l_{d,xy} i_{d,xy} + \lambda_{mg,xy}$$

$$\lambda_{q,xy} = l_{q,xy} i_{q,xy}$$

And the leakage fluxes are described as:

$$\lambda_{ld,\alpha\beta} = l_{ld,\alpha\beta} i_{d,\alpha\beta} \quad (18)$$

$$\lambda_{lq,\alpha\beta} = l_{lq,\alpha\beta} i_{q,\alpha\beta}$$

$$\lambda_{ld,o_1o_2} = l_{ld,o_1o_2} i_{d,o_1o_2}$$

$$\lambda_{lq,o_1o_2} = l_{lq,o_1o_2} i_{q,o_1o_2}$$

$$\lambda_{ld,xy} = l_{ld,xy} i_{d,xy}$$

$$\lambda_{lq,xy} = l_{lq,xy} i_{q,xy}$$

By substituting equations (17) and (18) in equation (16) while considering only steady-state operation and ignoring the components of the o1o2 subspace, the voltages in the dq reference frame of the αβ and xy subspaces may be:

$$u_{d,\alpha\beta} \approx r_s i_{d,\alpha\beta} - \omega_{me} l_{q,\alpha\beta} i_{q,\alpha\beta} - \omega_{me} l_{lq,\alpha\beta} i_{q,\alpha\beta}$$

$$u_{q,\alpha\beta} \approx r_s i_{q,\alpha\beta} + \omega_{me} l_{d,\alpha\beta} i_{d,\alpha\beta} + \omega_{me} l_{ld,\alpha\beta} i_{d,\alpha\beta} + \omega_{me}\lambda_{mg,\alpha\beta} \quad (19)$$

$$u_{d,xy} \approx r_s i_{d,xy} - 5\omega_{me} l_{q,xy} i_{q,xy} - 5\omega_{me} l_{lq,xy} i_{q,xy}$$

$$u_{q,xy} \approx r_s i_{q,xy} + 5\omega_{me} l_{d,xy} i_{d,xy} + 5\omega_{me} l_{ld,xy} i_{d,xy} + 5\omega_{me}\lambda_{mg,xy} \quad (19)$$

The back-electromotive force is not purely sinusoidal; thus, it contributes to the generation of low-order harmonics. Furthermore, the harmonic components in the o1o2 may be ignored. This can be done if the neutral of the first and second 3-phase windings is grounded.

It can be observed that equation (20) is a second model expression that defines a secondary harmonics relationship between the voltage and current of the electrical machine, where the secondary harmonics relationship has a dependency on the leakage inductance $I_l$. It can also be seen that equation (20) comprises a definition of the relationship between voltage and current for low order harmonics and more particular for the $5^{th}$ and $7^{th}$ order harmonics.

Figure 4:
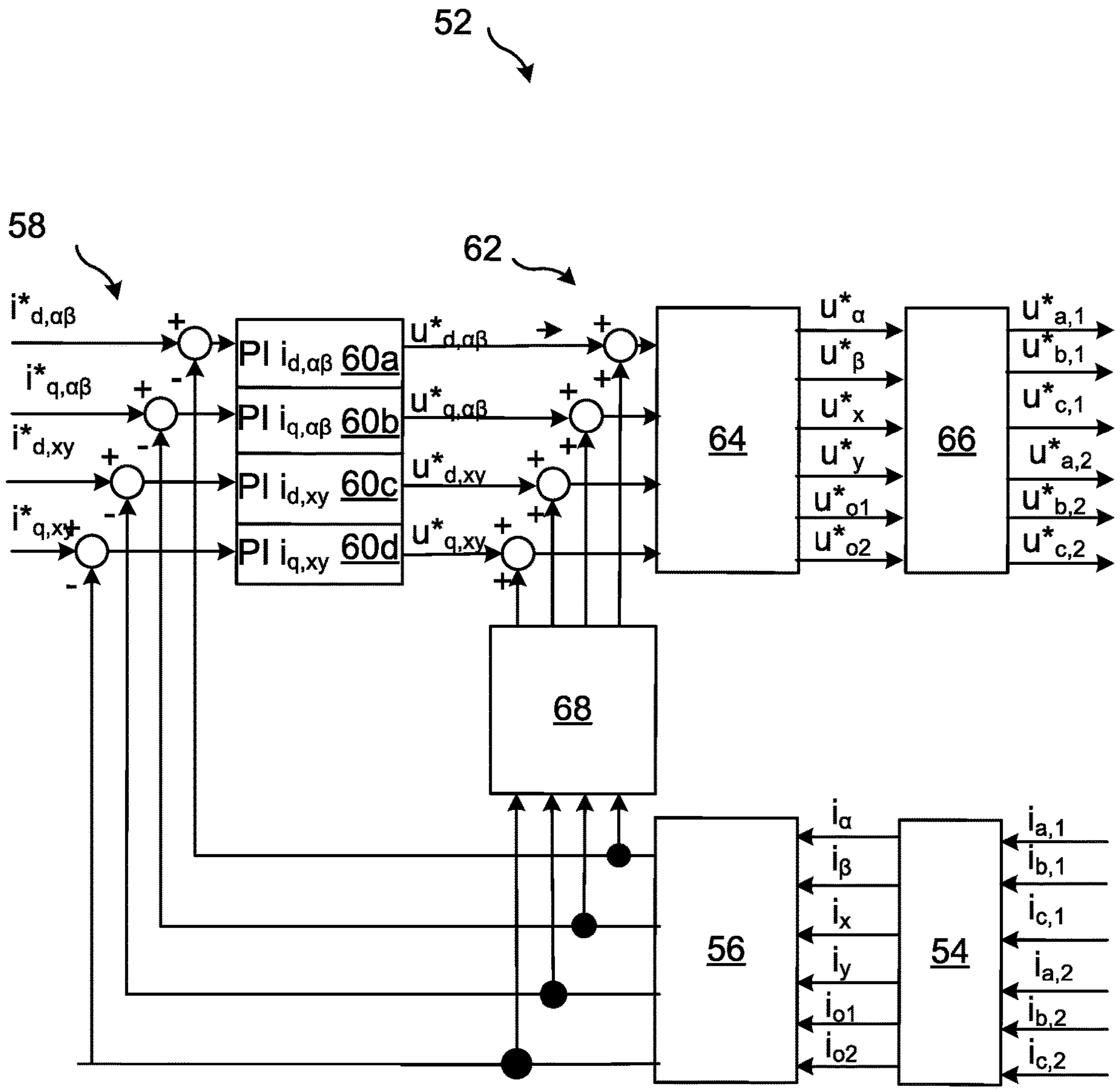
FIG. 4 shows a control structure that may be used by the estimating device for estimating the leakage inductance of the electrical machine, and FIG. 5 schematically shows a data carrier with computer program code, in the form of a CD-ROM disc, for implementing a leakage inductance estimating function of the estimating device.
Figure 5:
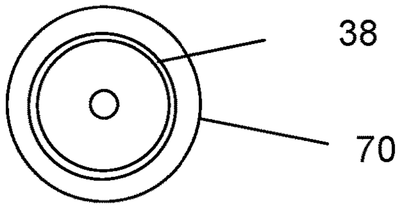

FIG. 4 shows a control structure 52 in the estimating device that is suitable for use in the second machine investigation scheme using the VSD control model. With some modifications this structure can also be used in the first machine investigation scheme.

The control structure 52 is used for controlling both 3-phase windings of the electrical machine using the first and the second machine drive 18 and 20 of the machine drive stage 16.

The VSD control model allows describing the dynamic behaviour of certain odd harmonics in a multi-phase electrical machine. The certain odd harmonics include the fundamental frequency i.e., the $1^{st}$ harmonic, the $3^{rd}$ harmonic, the $5^{th}$ harmonic, etc. up to the number of phases m if m is an odd number or up to the number of phases minus one, i.e. m−1, if m is an even number.

The current sensors (not shown) are configured to measure the phase currents of the second set of phases and send them to a first transformation block 54.

The first transformation block 54 is configured to perform VSD transformation of the currents from the abc plane to the αβ subspace, to the xy subspace and to the o1o2 subspace. It thus transforms the currents ia,1, ib,1, ic,1, ia,2, ib,2 and ic,2 to currents 1α, iβ, ix, iy, io1 and io2, which are in turn supplied to a second transformation block 56 that performs a Park transformation of the currents to the dq domain. It can also be noted that only dq currents from the αβ subspace and xy subspace are output from the second transformation block 56. Thereby no currents from the o1o2 subspace are used, which is due to the neutrals of both 3-phase windings being grounded.

The dq transformed currents id,αβ, iq,αβ, id,xy and iq,xy of the second transformation block 56 are provided as VSD currents, which VSD currents are provided to a group of first combiners 58, for forming an error signal as a difference to current control set points i*d,αβ, i*q,αβ, i*d,xy and i*q,xy. The dq transformed currents are also supplied to an axis decoupling block 68.

Each first combiner 58 determines the difference between the corresponding VSD current and the corresponding setpoint current to obtain a control error.

The control errors from the first group of combiners 58 are provided to respective first current controllers 60*a*, 60*b*, 60*c* and 60*d*. The first current controllers 60*a*, 60*b*, 60*c* and 60*d* may be proportional-integral (PI) regulators. The first current controllers 60*a*, 60*b*, 60*c* and 60*d* process the control errors from the group of first combiners 58 to obtain respective control signals. The control signals are in the present example voltage references. For example, denotes the d-component voltage reference in the αβ subspace, $u_{d,\alpha\beta}$* denotes the q-component voltage reference in the αβ subspace, $u_{d,xy}$* denotes the d-component voltage reference frame in the xy subspace and $u_{q,xy}$* denotes the q-component voltage reference in the xy subspace.

The control signals are provided to a second group of combiners 62 in which the voltages from the current controller are added to voltage references from the axis decoupling block 68. The axis decoupling block 68 decouples the d and q component current controls and generates corresponding feed-forward voltage values to enable field-oriented control. The combined signals from the second group of combiners 62 are then supplied to a first inverse transformation block 64 for performing reverse Park transformation, i.e. for transforming the voltages to the αβ subspace, the xy subspace and the o1o2 subspace. The transformed control voltages u*α, u*β, u*x, u*y, u*o1 and u*o2 are then provided to a second inverse transformation block 66, where they are transformed into the abc plane and then supplied to the first and second machine drives of the machine drive stage.

The second transformation block 56 and the first inverse transforming block 64 may also receive the mechanical machine speed multiplied with the number of pole pairs for use in the Park and Inverse Park transformations. As an alternative it is possible that the transformations are based on the electrical angle of the electrical machine 12.

The structure that has been described so far is used for implementing the VSD control model.

The structure may be adapted to be used with the DTP control model through the first transformation block 54 transforming into the harmonic subspace and the second inverse transforming block transforming from the harmonic subspace to the abc plane. It is also possible to halve the number of combiners in the first and second groups of combiners as well as to halve the number of PI controllers because the control currents are dq transformed harmonic subspace currents id,h and iq,h.

The second embodiment for estimating the leakage inductance will now be described.

After the method is started, the following operations may take place:

1. Firstly, only one of the two three-phase windings is controlled under a conventional three-phase control approach. In this case, the load torque is half of that of the six-phase electrical machine, and the main machine parameters of equation (7) can be identified by conducting the standard three-phase tests. The main electrical parameters of the first 3-phase winding are thus determined based on the first voltage and the first set of measured currents, using standard tests on the fundamental components of the first voltage and the first set of current measurement.

2. Afterward, the voltages and phase currents are captured, and a Fast Fourier transform is performed to decompose them in the frequency domain components. A Model Reference Adaptive Identification (MRAI) algorithm may then be employed to identify the parameters of equation (11) and equation (15) through minimizing the error of the magnitudes of the fundamental, $5^{th}$, and $7^{th}$ harmonics. The MRAI algorithm can be replaced by an automated routine. This is considered to be the performing of three-phase complimentary tests.

As was mentioned earlier Equations (11) and (15) are examples of a first model expression that defines a primary harmonics relationship between the voltage and current of the electrical machine and into which the first voltage and the first set of measured currents are applied. It is also evident that these equations comprise a definition of the relationship between voltage and current for low order harmonics.

In order to allow the leakage inductances to be estimated under different operating conditions, the machine load and speed may vary. New operating points may thus be set through speed/and or load changes. If there are more operating points, then the speed and/or load is changed, and the performing of three-phase complimentary tests and optionally also the conducting the standard three-phase tests is continued. However, if there are no more operating points, then the second machine investigation scheme is started.

3. In a next step, the electrical parameters of the fundamental subspace of the six-phase configuration of equation (19), including the leakage inductance, can be estimated using standard tests. It is here additionally possible that the electrical parameters of the fundamental subspace of the VSD control model are estimated based on the main electrical parameters determined using the first voltage and first set of measured currents 4. Later, the whole electrical machine is operated by using the VSD control strategy shown in FIG. 4. In particular, the harmonics of the currents of the two three-phase windings are mapped, in the first transformation block 54, to the three subspaces αp, xy and o1o2 by using the transformation matrix, [T6(θ)]:

$$T_{abc\to VSD} = [T_6(\theta)] = \begin{bmatrix} 1 & \cos(\theta) & \cos(4\theta) & \cos(5\theta) & \cos(8\theta) & \cos(9\theta) \\ 0 & \sin(\theta) & \sin(4\theta) & \sin(5\theta) & \sin(8\theta) & \sin(9\theta) \\ 1 & \cos(5\theta) & \cos(8\theta) & \cos(\theta) & \cos(4\theta) & \cos(9\theta) \\ 0 & \sin(5\theta) & \sin(8\theta) & \sin(\theta) & \sin(4\theta) & \sin(9\theta) \\ 1 & 0 & 1 & 0 & 1 & 0 \\ 0 & 1 & 0 & 1 & 0 & 1 \end{bmatrix}$$

Since the low-order harmonics do not contribute to the production of DC torque and are separated in a different orthogonal subspace, it is possible to cease zeroing them without disturbing the load operation. In this case, the rows of the inverse transformation matrix used by the second inverse transformation block 66, [T6(θ)]−1, that correspond to the xy and o1o2 subspaces are replaced by zeros, and the generated voltage references affect only the torque producing components in the αβ subspace. It can thereby be seen that the controlling of all the 3-phase windings using the VSD control model involves a mapping of the second voltage and the second set of measured currents to the subspaces using the transformation matrix [T6(θ)] and where in the corresponding inverse transformation matrix [T6(θ)]−1 the rows and columns corresponding to the second and third subspace of the VSD control are set to zero.

Thereby all the machine phases are operated under VSD control, whereas the harmonics, other than those in the fundamental subspace, are not minimized. The machine operation is thus not disturbed. If minimizing the harmonics in the x-y subspace, then it would be impossible to apply the MRAI algorithm because the minimization error in the algorithm is defined as the difference in the magnitude of the low-order harmonics. In this way, the leakage inductances are estimated such that the harmonic content of the machine currents is of the same level in both schemes. A sinusoidal voltage supply is not needed because the sources of the low-order harmonics have been identified in the previous step and only the additional contribution of the xy equivalent circuit is considered.

5. The voltages and phase currents are again captured, and a Fast Fourier transform is performed to find the magnitudes and angles of the $5^{th}$ and $7^{th}$ harmonics. Then, an MRAI algorithm is used for the rest of the parameters of equation (20) including the leakage inductances in the xy subspace. These are six-phase complimentary tests, where, as was mentioned earlier, equation (20) forms a second model expression. The magnitudes and angles of the low order harmonics in the second set of currents are thereby identified before application in the second model expression. It can also be seen that equation (20) defines a secondary harmonics relationship between the voltage and current of the electrical machine, where the secondary harmonics relationship has a dependency on the leakage inductance $I_l$. It can also be seen that equation (20) comprises a definition of the relationship between voltage and current for low order harmonics and more particular for the $5^{th}$ order harmonics.

6. Also in the second machine investigation scheme, the machine load and speed may vary, in order to determine the leakage inductances under different operating conditions. It has been found that the leakage inductances in the subspaces other than the fundamental one significantly deviate when changing operating conditions.

Therefore, new operating points may be set through speed/and or load changes. If there are more operating points, then the speed and/or load is changed, and the performing of six-phase complimentary tests and optionally also estimating the electrical parameters of the fundamental subspace using standard tests and ceasing zeroing low-order harmonics is continued. However, if there are no more operating points, then the method is ended.

By repeating the steps 1 and 2 it is possible to determine sources of low-order harmonics and design-dependent parameters in the single three-phase case and then, to isolate them in the dual three-phase machine operation. That is because these sources exist in both three-phase and six-phase cases. Therefore, the values of a leakage inductance in the xy subspace can be approximated without the need of a sinusoidal voltage supply. The determined parameter may be stored as a function of the speed and current or averaged at the nominal operating condition.

The above-mentioned scheme may thereafter be repeated if further leakage inductances are to be estimated.

As was mentioned earlier the leakage inductance estimating function may be implemented as a computer program being operated on by a processor such as CPU, multiprocessor microcontroller or DSP. The computer program may also be realized as a computer program product comprising a data carrier with the computer program. One such data carrier 70 or non-volatile storage medium, in the form of CD Rom disk comprising the computer program 38 is schematically shown in FIG. 6. It should be understood that the data carrier is not limited to CD ROM disks, but may as an example be realized as a USB (Universal Serial Bus) memory or a Flash memory instead.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A method of estimating at least one leakage inductance of a 3n-phase electrical machine having at least two 3-phase windings, the method comprising:

performing a first machine investigation scheme comprising:

ordering a machine drive stage to control one of the 3-phase windings, obtaining from said one of the 3-phase windings a first set of measured currents (ia,1, ib,1, ic,1) of three phases of the electrical machine, and processing the first set of measured currents to obtain primary characteristics of an electrical quantity of the electrical machine, performing a second machine investigation scheme including:

ordering the machine drive stage to control all the 3-phase windings using a vector space decomposition (VSD) control model, where the controlling involves only controlling a first fundamental subspace of the VSD control model, obtaining a second set of measured currents (ia,1, ib,1, ic,1, ia,2, ib,2, ic,2) from all 3-phase windings, and processing the second set of measured currents to obtain a leakage inductance estimate and secondary characteristics of the electrical quantity of the electrical machine, for which leakage inductance estimate the primary and secondary characteristics match.

2. The method as claimed in claim 1, wherein the processing in the second machine investigation scheme includes a number of iterations, where the obtained leakage inductance estimate of a first iteration is an initial leakage inductance estimate for which the primary and secondary characteristics differ from each other and the processing further includes obtaining increased or decreased leakage inductance estimates until the primary and secondary characteristics match, where the leakage inductance estimate of the iteration when there is a match is a final leakage inductance estimate.

3. The method as claimed in claim 2, wherein the primary characteristics comprises a primary harmonics content of the electrical quantity and the secondary characteristics includes a secondary harmonics content of the electrical quantity.

4. The method as claimed in claim 2, wherein the ordering of the machine drive stage to control said one of the 3-phase windings includes ordering the machine drive stage to control said one of the 3-phase windings using a first voltage, and the ordering of the machine drive stage to control all the 3-phase windings using the vector space decomposition (VSD) control model includes ordering the machine drive stage to control all the 3-phase windings using a second voltage.

5. The method as claimed in claim 1, wherein the primary characteristics comprises a primary harmonics content of the electrical quantity and the secondary characteristics includes a secondary harmonics content of the electrical quantity.

6. The method as claimed in claim 1, wherein the ordering of the machine drive stage to control said one of the 3-phase windings includes ordering the machine drive stage to control said one of the 3-phase windings using a first voltage, and the ordering of the machine drive stage to control all the 3-phase windings using the vector space decomposition (VSD) control model includes ordering the machine drive stage to control all the 3-phase windings using a second voltage.

7. The method as claimed in claim 6, wherein the primary characteristics comprises a primary harmonics content of the electrical quantity and the secondary characteristics includes a secondary harmonics content of the electrical quantity, and wherein the processing in the first machine investigation scheme includes applying the first voltage and the first set of measured currents in a first model expression that defines a primary harmonics relationship between voltage and current of the electrical machine.

8. The method as claimed in claim 7, wherein the first model expression comprises a definition of the relationship between voltage and current for low order harmonics.

9. The method as claimed in claim 8, wherein the low order harmonics include harmonics below the $20^{th}$ order harmonics.

10. The method as claimed in claim 8, wherein the low order harmonics include harmonics below the $13^{th}$ order harmonics.

11. The method as claimed in claim 8, further comprising identifying parameters in the first model expression through minimizing an error of a magnitude of a fundamental current and/or errors of magnitudes of low order harmonics.

12. The method as claimed in claim 6, wherein the primary characteristics comprises a primary harmonics content of the electrical quantity and the secondary characteristics includes a secondary harmonics content of the electrical quantity, and in the second machine investigation scheme, the processing comprises applying the second voltage and said second set of measured currents in a second model expression that defines a secondary harmonics relationship between voltage and current of the electrical machine, where said secondary harmonics relationship has a dependency on the leakage inductance ($I_l$).

13. The method as claimed in claim 12, wherein the second model expression comprises a definition of the relationship between voltage and current for low order harmonics.

14. The method as claimed in claim 13, wherein the low order harmonics include harmonics below $20^{th}$ order harmonics.

15. The method as claimed in claim 13, wherein the low order harmonics include harmonics below the $13^{th}$ order harmonics.

16. The method as claimed in claim 13, further comprising identifying magnitudes and angles of the low order harmonics in the second set of currents before application in the second model expression.

17. The method as claimed in claim 6, further comprising estimating electrical parameters of the first fundamental subspace of the VSD control model based on parameters determined using the first voltage and the first set of measured currents.

18. A device for estimating at least one leakage inductance of a 3n-phase electrical machine having at least two 3-phase windings, the device comprising a processor being operative to:

perform a first machine investigation scheme comprising:

order a machine drive stage to control one of the 3-phase windings, obtain from said one of the 3-phase windings a first set of measured currents (ia, 1, ib, 1, ic, 1) of three phases of the electrical machine, and process the first set of measured currents to obtain primary characteristics of an electrical quantity of the electrical machine, and perform a second machine investigation scheme including:

order the machine drive stage to control all the 3-phase windings using a vector space decomposition (VSD) control model, where the controlling involves only controlling a first fundamental subspace of the VSD control model, obtain a second set of measured currents (ia,1, ib,1, ic,1, ia,2, ib,2, ic,2) from all 3-phase windings, and process the second set of measured currents to obtain a leakage inductance estimate and secondary characteristics of the electrical quantity of the electrical machine, for which leakage inductance estimate the primary and secondary characteristics match.

19. A non-transitory computer-readable medium containing computer executable instructions to perform a method for estimating at least one leakage inductance of a 3n-phase electrical machine having at least two 3-phase windings, the method comprising:

a non-transitory data carrier with computer program code which when run by a processor implements an operation with a method of:

performing a first machine investigation scheme comprising:

ordering a machine drive stage to control one of the 3-phase windings, obtaining from said one of the 3-phase windings a first set of measured currents of three phases of the electrical machine, and processing the first set of measured currents to obtain primary characteristics of an electrical quantity of the electrical machine, performing a second machine investigation scheme including:

ordering the machine drive stage to control all the 3-phase windings using a vector space decomposition (VSD) control model, where the controlling involves only controlling a first fundamental subspace of the VSD control model, obtaining a second set of measured currents from all 3-phase windings, and processing the second set of measured currents to obtain a leakage inductance estimate and secondary characteristics of the electrical quantity of the electrical machine, for which leakage inductance estimate the primary and secondary characteristics match.

20. An electrical machine system comprising:

a 3*n*-phase electrical machine having at least two 3-phase windings, a machine drive stage configured to be connected to the electrical machine for controlling the 3-phase windings of the electrical machine, and a device for estimating at least one leakage inductance of the 3n-phase electrical machine, wherein the device including a processor being operative to:

perform a first machine investigation scheme comprising:

order the machine drive stage to control one of the 3-phase windings, obtain from said one of the 3-phase windings a first set of measured currents of three phases of the electrical machine, and process the first set of measured currents to obtain primary characteristics of an electrical quantity of the electrical machine, and perform a second machine investigation scheme including:

order the machine drive stage to control all the 3-phase windings using a vector space decomposition control model, where the controlling involves only controlling a first fundamental subspace of the VSD control model, obtain a second set of measured currents from all 3-phase windings, and process the second set of measured currents to obtain a leakage inductance estimate and secondary characteristics of the electrical quantity of the electrical machine, for which leakage inductance estimate the primary and secondary characteristics match.

* * * * *